United States Patent [19]

Fukuyama et al.

[11] 4,218,291
[45] Aug. 19, 1980

[54] PROCESS FOR FORMING METAL AND METAL SILICIDE FILMS

[75] Inventors: Toshihiko Fukuyama; Shintaro Yanagisawa, both of Kawasaki, Japan

[73] Assignee: Vlsi Technology Research Association, Japan

[21] Appl. No.: 15,896

[22] Filed: Feb. 28, 1979

[30] Foreign Application Priority Data

Feb. 28, 1978 [JP] Japan .............................. 53-22526/78
Feb. 28, 1978 [JP] Japan .............................. 53-22527/78

[51] Int. Cl.² ............................................. C23C 15/00
[52] U.S. Cl. ............................... 204/1 T; 204/192 SP; 204/192 F
[58] Field of Search .......... 204/192 C, 192 SP, 192 F

[56] References Cited
PUBLICATIONS

R. W. Wilson et al, "Application of High-Rate ExB or Magnetron Sputtering in the Metallization of Semiconductor Devices", J. Vac. Sci. Technol., vol. 13, pp. 157-164, (1976).

R. S. McLeod et al, "High-Rate Sputtering of Aluminum for Metallization of Integrated Circuits", J. Vac. Sci. Technol., vol. 14, pp. 263-265, (1977).

Primary Examiner—Aaron Weisstuch
Attorney, Agent, or Firm—Staas & Halsey

[57] ABSTRACT

In the past a film of a transition metal silicide or an aluminum silicon alloy has been deposited on a semiconductor substrate by vacuum evaporation and used as an electrode or wiring of a semiconductor device. According to the present invention, the film is produced by a sputtering method wherein the silicon component of the film is not supplied from the target but from a gaseous silicon compound contained in the sputtering atmosphere.

19 Claims, 5 Drawing Figures

PROCESS FOR FORMING METAL AND METAL SILICIDE FILMS

BACKGROUND OF INVENTION

1. Field of Invention

The present invention relates to a process for forming a conductive film, and more particularly a process for forming a metal film used for the electrodes and/or wiring of a semiconductor device, especially a semiconductor integrated circuit.

2. Description of Prior Art

Aluminum and doped polycrystalline silicon have conventionally been used for the conductive film mentioned above. One of the new materials, which has recently been found to be suitable for the conductive metal film mentioned above, is a silicide of a transition metal, particularly a refractory metal, such as tungsten and moleybdenum. The transition metal silicide has a lower resistance than the polycrystalline silicon, which is frequently used as the electrode material of an insulated gate field effect transistor (IG FET). In addition, the transition metal silicide is stable at an elevated temperature and exhibits a fine grain size. Accordingly, the transition metal silicide can be shaped into a fine electrode and circuit pattern, and thus, plays more and more of an important role in the production of a highly integrated, high speed semiconductor device. Another of the new materials is an aluminum silicon alloy which contains from 2 to a few percent of silicon. The addition of silicon to the aluminum can prevent undesirable reactions, which occur between the electrode metal and the semiconductor substrate, for example, during sintering of the electrode metal. Accordingly, the aluminum silicon alloy is attractive for the production of a highly integrated, high speed semiconductor device, such as an integrated circuit.

It is known that a transition metal silicide film or an aluminum silicon alloy film can be produced by one of the processes of: (a) vacuum evaporation of a metal or alloy composition which is locally heated by an electron gun; (b) simultaneous vacuum evaporation of the two components of the alloy or silicide from different evaporation sources with the aid of electron guns; (c) vacuum evaporation of the alloy by a flashing method, wherein the metal or alloy powders are dispersed onto a heater, flashed and evaporated by the heater, and; (d) sputtering of a target consisting of the alloy.

Processes (a) and (c) mentioned above are commonly disadvantageous due to the fact that, in repeated deposition of the film of the alloy on the substrate, for example a semiconductor substrate, the reproducibility of the alloy composition is too low.

Processes (a) and (b) mentioned above are commonly disadvantageous, due to a secondary electron emission from the vaporization source the semiconductor substrate is damaged. This is one of the causes of: dispersion of the resistance value of the film made of alloy; deterioration of electrical properties of the semiconductor element which is formed on the surface of the semiconductor substrate, and; a decrease in reliability of the semiconductor device.

It is recognized by experts in the semiconductor device field that, according to the process (d), the transition metal silicide or the aluminum silicon alloy film can be produced repeatedly with excellent reproducibility of the film composition because the same composition as that of a target made of the silicide or alloy is sputtered from the target and deposits on the semiconductor substrate. However, the silicon content of the film cannot be adjusted optionally unless the target composition is changed.

SUMMARY OF INVENTION

It is, therefore, an object of the present invention to provide a process for forming a film of a transition metal silicide or an aluminum silicon alloy, wherein the desired composition of the film can be easily provided and, further, such film composition can be repeatedly provided with excellent reproducibility.

In accordance with the present invention, there is provided, in a process for forming on a substrate a metal film comprising a transition metal silicide by sputtering a target, the improvement which comprises constituting the target from the transition metal and performing the sputtering in an inert gas atmosphere which contains a silicon hydride.

There is also provided, in a process for forming on a substrate an alloy film composed of mainly aluminum and additionally silicon by sputtering a target, the improvement which comprises constituting the target from aluminum and performing said sputtering in an inert gas atmosphere which contains a silicon hydride as the source of silicon contained in the alloy film.

The silicon component of the transition metal silicide or the aluminum silicon alloy is not supplied from the target but from the sputtering atmosphere, which contains a silicon hydride in a predetermined amount. The silicon content of the film deposited on the semiconductor substrate is adjusted by selecting, firstly, the partial pressure of silicon hydride in the inert gas atmosphere and, secondly, such conditions as the amount of electric power applied between the target and the anode. The silicon content in the film can be greatly varied and repeatedly reproduced according to the present invention than by selecting the target composition according to prior art.

The silicon hydride contained in the inert gas atmosphere forms reactive species, such as $Si^+$, $H^{2+}$, $SiH^+$, $SiH_2^+$ and $SiH_3^+$ during sputtering. Hydrogen, which is also formed during sputtering, prevents damage of the semiconductor substrate due to secondary electron emission during the sputtering, with the consequence that the electrical properties of the semiconductor elements and the reliability of the semiconductor integrated circuit are enhanced over those resulting from conventional sputtering.

According to the present invention, a double layer structure, which consists of a transition metal layer and a transition metal silicide layer, can be produced by the process which comprises the steps of:

placing in a sputtering apparatus a target which consists of the transition metal;

introducing into the sputtering apparatus an inert gas and a silicon hydride gas;

performing the sputtering, thereby forming the transition metal silicide film;

introducing an inert gas into the sputtering apparatus, and;

performing the sputtering, thereby, forming the transition metal film.

DESCRIPTION OF THE PREFERRED EMBODIMENTS

In the embodiment of the processes according to the present invention, the silicon hydride is at least one member selected from the group consisting of monosilane (SiH$_4$), disilane (Si$_2$H$_6$) dichlorosilane (SiH$_2$Cl$_2$) and trichlorosilane (SiHCl$_3$). The silicon hydride is preferably monosilane (Si$_4$). The gaseous silicon hydride for forming the transition metal silicide is contained in the inert gas, such as argon, in an amount of from 10 to 80 vol. %, based on the total gaseous mixture. The gaseous silicon hydride for forming the aluminum silicon alloy is contained in the inert gas in an amount of from 1 to 40 vol.% based on the total gaseous mixture. The reactive species are formed during the sputtering due to the decomposition of the silicon hydride under a plasma state. Since the metal sputtered from the target is brought into a reaction with the reactive species in the atmosphere and the reaction product deposits on the substrate, the process according to the present invention is so called reactive sputtering.

In another embodiment of the present invention, the transition metal is a member selected from the group consisting of tungsten, molybdenum, nickel, platinum, chromium and titanium. The transition metal is preferably tungsten or molybdenum. Transition metal silicides, which can be produced by the present invention, may contain silicon in an amount corresponding to an atomic ratio of (Si/transition metal) ranging from 0.01 to 3. Examples of several transition metal silicides are the stoichiometric compounds: dimolybdenum trisilicide (Mo$_2$Si$_3$), ditungsten trisilicide (W$_2$Si$_3$), monotungsten disilicide (WSi$_2$), monotungsten trisilicide (WSi$_3$); diplatinum monosilicide (Pt$_2$Si), monoplatinum monosilicide (PtSi), and the like. However, non-stoichiometric silicides may be produced by the process of the present invention. When the silicon content in the film is low, the film consists of the mixture of the stoichiometric or non-stoichiometric silicide and the transition metal.

In a further embodiment of the present invention, a film made of aluminum or its alloy contains from 0.2 to 20% by weight of silicon. When the film contains a few percent of at least one metal of chosen from copper, chromium, nickel and magnesium, the electro-migration of aluminum atoms into the semiconductor substrate may be prevented effectively. It is preferable to use copper as the at least one metal mentioned above.

The transition metal silicide film produced by the reactive sputtering mentioned above is heated in a non oxidizing atmosphere to a temperature of from 500° to 1200° C., thereby decreasing the resistivity of the film to a value sufficiently low for wiring material. The pressure of the inert gas atmosphere is adjusted in the range of from $1 \times 10^{-3}$ to $9 \times 10^{-3}$ Torr, when the sputtering apparatus explained hereinbelow is used for the formation of metal film. However, when another sputtering apparatus is used, the pressure of the inert gas atmosphere is adjusted so as to generate a plasma state in the sputtering atmosphere.

In still another embodiment of the present invention, the following double layer structures can be produced by the present invention at a lower cost than by the prior art using two kinds of the targets. Namely, a double layer structure, which consists of an upper metal layer and a lower metal silicide- or aluminum silicon alloy-layer, can be produced by sputtering the metal target in a conventional inert gas atmosphere containing the silicon hydride and, then, sputtering the same metal target in an inert gas atmosphere free from the silicon hydride. The other double layer structure, which consists of a lower transition metal layer and an upper transition metal silicide layer, can be produced by sputtering a transition metal target in a conventional inert gas atmosphere and then sputtering the same target in an inert gas atmosphere containing the silicon hydride. Such a double layer structure has excellent resistance against an oxidizing gas because the transistion metal layer is covered by the silicide layer. Such double layer structures also have a low resistivity due to the upper or lower metal layer. By means of the above mentioned processes for producing the double layer structures, such structures can be produced simply by introducing the silicon hydride into the sputtering apparatus.

BRIEF DESCRIPTION OF DRAWING

The present invention will be explained in detail with reference to Examples and the drawing, wherein.

EXAMPLES

Figure 1:
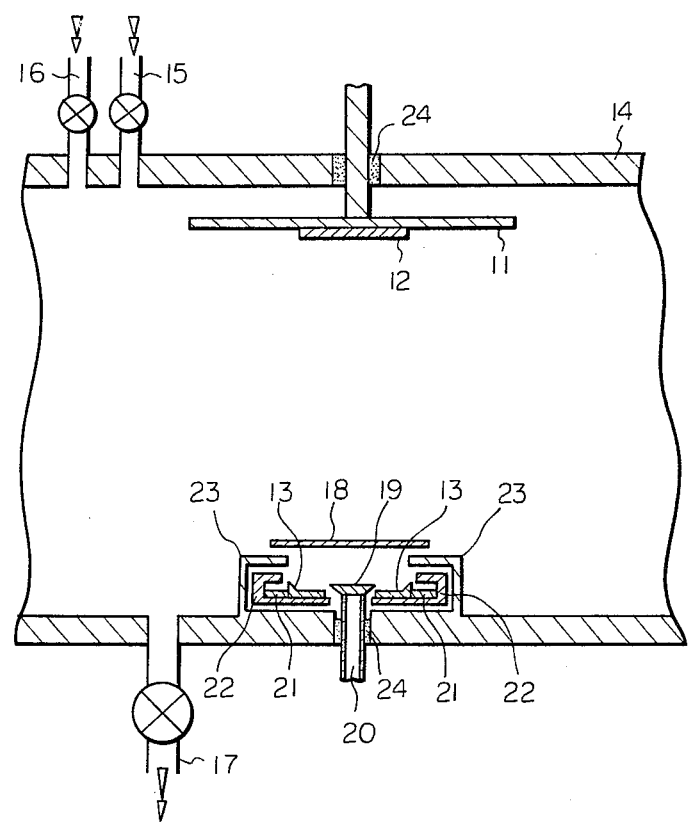
FIG. 1 illustrates a partial cross sectional view of a sputtering apparatus used in the Examples.

In FIG. 1, the vessel of the sputtering apparatus referred to hereinafter as a bell jar, is denoted as 14. The bell jar 14 is fitted with various parts of the sputtering apparatus as described hereinbelow. A supporting plate 11 for a substrate 12 is mounted on the bell jar 14 via an air tight seal 24. Tubes 15 and 16 are secured to the wall of the bell jar 14 and communicate with the chamber of the bell jar 14 so as to feed silicon hydride an argon, respectively, into the chamber. On the side of the bell jar 14 opposite to the side at which the substrate 12 is located there is positioned a mechanism, referred to as a sputter gun, for sputtering a target. The sputter gun includes an anode 19 and a cooling tube 20 for cooling the anode 19. The cooling tube 20 extends through an air tight seal 24 of the bell jar 14. The target 13, in the form of a ring, is positioned coaxially with respect to the anode 19. The target 13 is water cooled by a cooling jacket 21. A magnet 22 and a magnetic shield 23 surround the target 13, so as to enclose within them the magnetic flux emanating from the target. Plasma generated by an electrical discharge between the target 13 and the anode 19 is also enclosed in the inner space defined by the magnet 21, magnetic shield 23 and a shutter 18. The chamber of the bell jar 14 is evacuated to a predetermined pressure by means of a vacuum tube 17.

Although the sputtering apparatus illustrated in FIG. 1 has been explained in detail hereinabove, any other sputtering apparatuses can be used for the sputtering process of the present invention.

EXAMPLE 1

The sputtering of a molybdenum silicide film was carried out by using the sputtering apparatus as shown in FIG. 1 under the following conditions.

Substrate 12: a silicon semiconductor substrate having a diameter of 75 mm.
Target 13: Commercially pure molybdenum plate
Inner pressure of bell jar 14 prior to introduction of reaction gas: $1.0 \times 10^{-6}$ Torr
Partial pressure of monosilane: $1.2 \times 10^{-3}$ Torr
Partial pressure of argon: $1.8 \times 10^{-3}$ Torr
Power: 2 K Watts After 15 minutes of sputtering a film 0.3 micron thick was deposited on the semiconductor substrate 12. The film was revealed after chemical analysis to be a molybdenum silicide having an atomic ratio (Si/Mo) of 0.17. The resistivity of the film was $8 \times 10^{-5}$ ohm-cm as deposited. The molybdenum silicide film so produced was heated to 1000° C. for 30 minutes in nitrogen gas. The resistivity decreased to $3 \times 10^{-5}$ ohm-cm.

Figure 2:
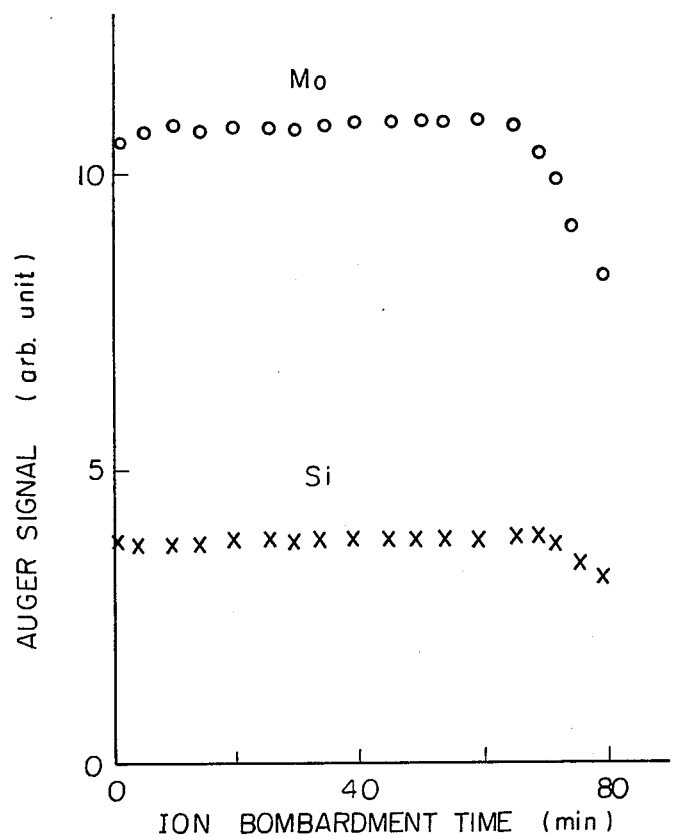
FIG. 2 is a graph representing the relationship between an Auger signal and ion bombardment time.

The film produced in the present Example was subjected to an Auger analysis of the Mo and Si distribution by gradually removing the film surface by ion bombardment. The analysis results are illustrated in FIG. 2. It will be understood from FIG. 2 that the film has a uniform molybdenum and silicon content from the surface to the bottom thereof.

EXAMPLE 2

The same procedure as described in Example 1 was repeated, except that: (1) the partial pressure of monosilane was varied, and; (2) the power was 0.6 K Watts and 2.0 k Watts.

Figure 3:
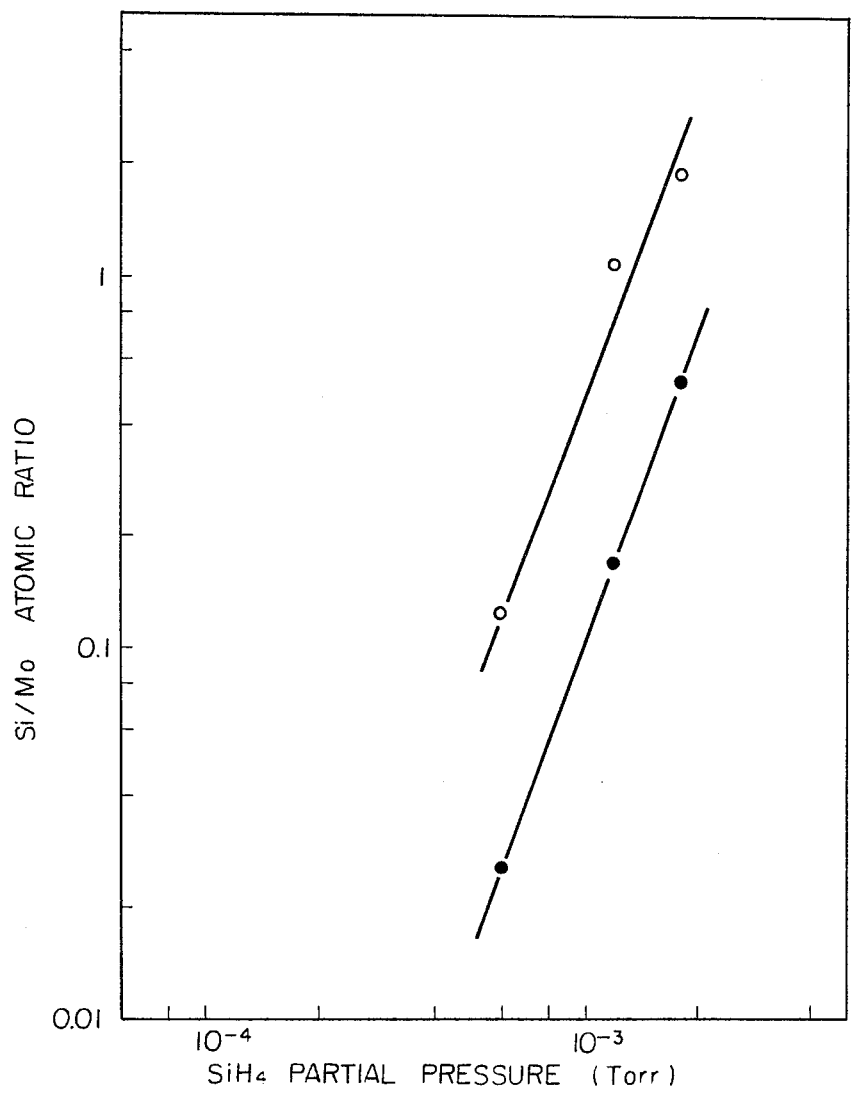
FIG. 3 is a graph representing the relationship between the partial pressure of monosilane and the atomic ratio Si/Mo.

The atomic ratio of Si/Mo of the produced molybdenum silicide is illustrated in FIG. 3, wherein the symbols o and ● indicate a power of 0.6 K Watts and 2.0 K Watts, respectively. From FIG. 3 it will be understood that a desired amount of the silicon can be doped into the molybdenum by adjusting the partial pressure of the monosilane.

Figure 4:
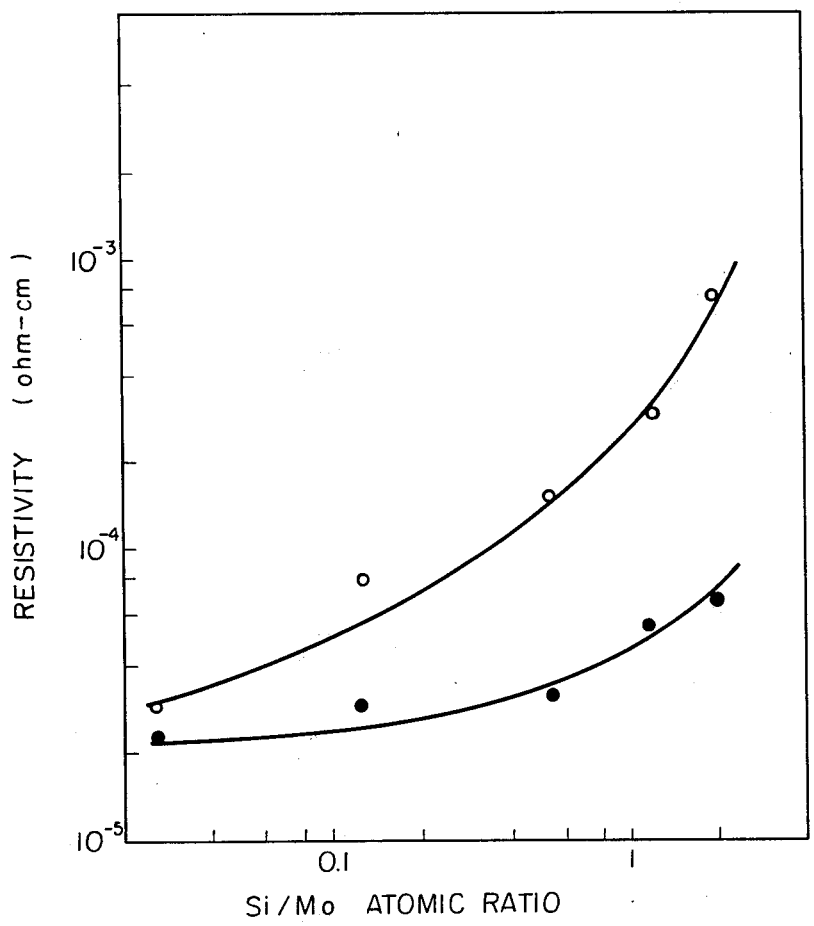
FIG. 4 is a graph representing the relationship between the atomic ratio Si/Mo and the resistivity of molybdenumsilicide film.

The resistivities of the molybdenum silicide films as deposited and after heating to 1000° C. for 30 minutes in a nitrogen gas, were measured. The results of the resistivity measurement are illustrated in FIG. 4, wherein the symbol o and ● indicate the resistivity as deposited and after heating, respectively.

EXAMPLE 3

The sputtering of a tungsten silicide film was carried out under the following conditions.

Substrate 12: a silicon semiconductor substrate having a diameter of 75 mm.
Target 13: Commercially pure tungsten plate
Inner pressure of bell jar 14 prior to introduction of reaction gas: $1 \times 10^{-6}$ Torr
Partial pressure of monosilane: $1.8 \times 10^{-3}$ Torr
Partial pressure of argon: $1.2 \times 10^{-3}$ Torr
Power: 0.8 K Watts After 25 minutes of sputtering a film 0.3 micron thick was deposited on the semiconductor substrate 12. The film was revealed, after chemical analysis, to be a tungsten silicide having an atomic ratio (Si/W):2.0. The resistivity of the film as deposited was $9 \times 10^{-4}$ ohm-cm. The tungsten silicide film so produced was heated to 1000° C. for 30 minutes in nitrogen gas. The resistivity decreased to $5 \times 10^{-5}$ ohm-cm.

EXAMPLE 4

The sputtering of a platinum silicide film was carried out under the following conditions.

Substrate 12: a silicon semiconductor substrate having a diameter of 75 mm.
Target 13: Commercially pure platinum plate
Inner pressure of bell jar 14 prior to introduction of reaction gas $1.0 \times 10^{-6}$ Torr
Partial pressure of monosilane: $1.2 \times 10^{-3}$ Torr
Partial pressure of argon: $1.8 \times 10^{-3}$ Torr
Power: 2.0 K Watts After 15 minutes of sputtering a film 0.3 micron thick was deposited on the semiconductor substrate 12. The film was revealed after chemical analysis to be a platinum silicide having atomic ratio (Pt/Si) of 1.0. The resistivity of the film as deposited was $6.0 \times 10^{-4}$ ohm-cm.

EXAMPLE 5

The sputtering of a titanium silicide film was carried out under the following conditions.

Substrate 12: a silicon semiconductor substrate having a diameter of 75 mm.
Target 13: Commercially pure titanium plate
Inner pressure of bell jar 14 prior to introduction of reaction gas: $1.0 \times 10^{-6}$ Torr
Partial pressure of monosilane: $1.8 \times 10^{-3}$
Partial pressure of an argon: $1.2 \times 10^{-3}$
Power: 0.6 K Watts After 25 minutes of sputtering a film 0.3 micron thick was deposited on the semiconductor substrate 12. The film was revealed after chemical analysis to be a titanium silicide having an atomic ratio (Ti/Si) of 2.0. The resistivity of the film as deposited was $8 \times 10^{-3}$ ohm-cm.

EXAMPLE 6

The sputtering of a film made of an aluminum silicon alloy was carried out using the sputtering device as show in FIG. 1 under the following conditions:

Substrate 12: a silicon semiconductor substrate having a diameter of 75 mm.
Target 13: Commercially pure aluminum plate
Inner pressure of bell jar 14 prior to introduction of reaction gas: $1.0 \times 10^{-6}$ Torr
Partial pressure of monosilane: $6.0 \times 10^{-4}$ Torr
Partial pressure of argon: $2.4 \times 10^{-3}$
Power: 6.0 K Watts After 20 minutes of sputtering a film 1.0 micron thick was deposited on the semiconductor substrate 12. The film was revealed after chemical analysis to be an aluminum alloy containing Si/Al: 0.04%. The resistivity of the film was $2.1 \times 10^{-4}$ ohm-cm.

EXAMPLE 7

The process of Example 6 was repeated under the same conditions as in Example 6, except that the target contained 4% by weight of copper. The obtained film contained 4% copper and exhibited a resistivity of $5.0 \times 10^{-5}$ ohm-cm.

EXAMPLE 8

Figure 5:
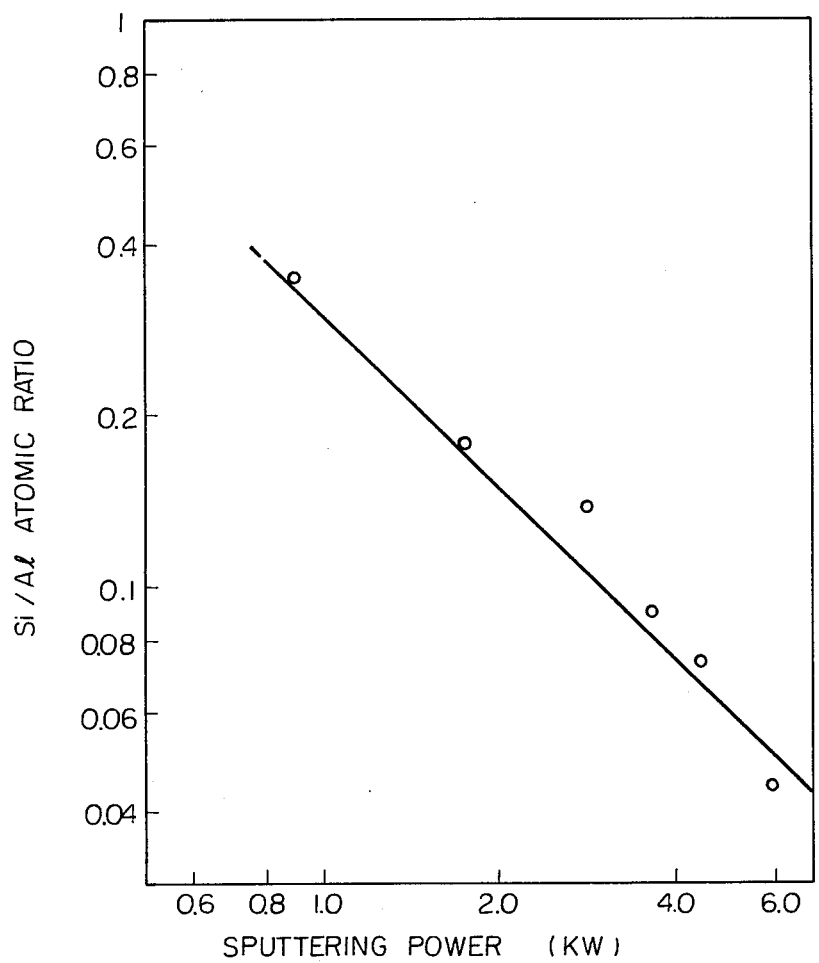
FIG. 5 is a graph representing the relationship between the sputtering power and the atomic ratio Si/Al of an aluminum silicon alloy.

The same procedure as described in Example 6 was repeated, except that the sputtering power was varied from approximately 0.9 to 6.0 K Watts. The atomic ratio Si/Al of the so produced film is illustrated in FIG. 5. From FIG. 5 it will be understood that the atomic ratio Si/Al can be controllably adjusted by changing the sputtering power.

What we claim is:

1. In a process for forming on a substrate a metal film comprising a transition metal silicide or silicides by sputtering a target, the improvement which comprises constituting said target from said transition metal and performing said sputtering in an inert gas atmosphere which contains a silicon hydride.

2. A process according to claim 1, wherein said silicon hydride is at least one member selected from the group consisting of monosilane, disilane, dichlorosilane and trichlorosilane.

3. A process according to claim 2, wherein said silicon hydride is monosilane.

4. A process according to claim 3, wherein said silicon hydride is contained in said inert gas atmosphere in a proportion of from 10 to 80 volume % based on the total gaseous mixture.

5. A process according to claim 4, wherein the atomic ratio of silicon relative to the transition metal of said transition metal silicide is from 0.01 to 3.

6. A process for forming on a substrate a double layer structure by sputtering, said double layer structure comprising a transition metal layer and a transition metal silicide layer, said process comprising the steps of:

placing in a sputtering apparatus a target which comprises said transition metal;

introducing into said sputtering apparatus an inert gas and a silicon hydride gas;

sputtering said target, thereby forming said transition metal silicide layer;

terminating the introduction of said silicon hydride gas;

introducing an inert gas into said sputtering apparatus; and sputtering said target, thereby forming said transition metal layer.

7. A process according to claim 6 wherein said silicon hydride gas is at least one member selected from the group consisting of monosilane, disilane, dichlorosilane and trichlorosilane.

8. A process according to claim 7, wherein said silicon hydride gas is monosilane.

9. A process according to claim 8, wherein said silicon hydride gas is contained in said inert gas atmosphere in a proportion of from 10 to 80 vol. % based on the total gaseous mixture.

10. A process according to claim 9, wherein the atomic ratio of silicon relative to the transition metal of said transition metal silicide is from 0.01 to 3.

11. In a process for forming on a substrate an alloy film composed of mainly aluminum and additionally silicon by sputtering of a target, the improvement which comprises constituting said target from aluminum and performing said sputtering in an inert gas atmosphere which contains a silicon hydride as the source of silicon contained in said alloy film.

12. A process according to claim 11, wherein the content of said silicon is in the range of from 0.2 to 20% by weight, based on said alloy.

13. A process according to claim 12 wherein said silicon hydride is at least one member selected from the group consisting of monosilane, disilane, dichlorosilane and trichlorosilane.

14. A process according to claim 13, wherein siad silicon hydride is monosilane.

15. A process according to claim 13 or 14, wherein said silicon hydride is contained in said inert gas atmosphere in a proportion of from 1 to 40 volume % based on the total gaseous mixture.

16. A process for forming on a substrate a double layer structure by sputtering, said double layer structure comprising an upper aluminum layer and a lower aluminum silicon alloy layer, said process comprising the steps of:

placing in a sputtering apparatus a target which comprises said aluminum;

introducing into said sputtering apparatus an inert gas and a silicon hydride gas;

sputtering said target, thereby forming said aluminum silicon alloy layer;

terminating the introduction of said silicon hydride gas into said sputtering apparatus, and;

sputtering said target, thereby forming said aluminum layer.

17. A process according to claim 16, wherein said silicon hydride gas is at least one member selected from the group consisting of monosilane, disilane, dichlorosilane and trichlorosilane.

18. A process according to claim 17, wherein said silicon hydride gas is monosilane.

19. A process for forming a double layer structure on a substrate by sputtering, said double layer structure comprising a transition metal layer and a transition metal silicide layer, said process comprising the steps of:

placing in a sputtering apparatus a target which comprises said transition metal;

introducing into said sputtering apparatus an inert gas;

sputtering said target, thereby forming said transition metal layer;

introducing into said sputtering apparatus a silicon hydride gas; and sputtering said target, thereby forming said transition metal silicide layer.

* * * * *

UNITED STATES PATENT AND TRADEMARK OFFICE
CERTIFICATE OF CORRECTION

PATENT NO. : 4,218,291
DATED : August 19, 1980
INVENTOR(S) : FUKUYAMA ET AL.

It is certified that error appears in the above—identified patent and that said Letters Patent is hereby corrected as shown below:

Front Page, [73], Assignee: "Vlsi" should be --VLSI--.

Column 1, line 47, "heater, and;" should be --heater; and--;
        line 61, "substrate, and;" should be --substrate; and--.

Column 2, line 24, "the" should be --an--;
        line 65, after "apparatus" change "," to --;--;
        line 66, after "and" delete ";".

Column 3, line 7, after "($Si_2H_6$)" insert --,--;
        line 9, "($Si_4$)." should be --($SiH_4$).--;
        line 52, "C.," should be --C,--.

Column 4, line 18, "DRAWING" should be --THE DRAWINGS--;
        line 21, "drawing," should be --drawings,--;
        line 31, "film, and;" should be --film; and--;
        line 45, "an" should be --and--.

Column 5, line 20, "C." should be --C--;
        line 34, "varied, and;" should be --varied; and--;
        line 43, after "films" insert --,--;
        line 44, "C." should be --C--;
        line 47, "symbol" should be --symbols--;
        line 67, "C." should be --C--.

UNITED STATES PATENT AND TRADEMARK OFFICE
CERTIFICATE OF CORRECTION

PATENT NO. : 4,218,291
DATED : August 19, 1980
INVENTOR(S) : FUKUYAMA ET AL.

It is certified that error appears in the above-identified patent and that said Letters Patent are hereby corrected as shown below:

Column 6, line 16, after "having" insert --an--;
line 41, "show" should be --shown--; after after "conditions" change ":" to --.--.

Column 7, line 45, after "claim 6" insert --or 19--.

Column 8, line 34, "apparatus, and;" should be --apparatus; and--.

Signed and Sealed this

Seventeenth Day of February 1981

[SEAL]

Attest:

RENE D. TEGTMEYER

Attesting Officer

Acting Commissioner of Patents and Trademarks